United States Patent [19]
Bonaccio

[11] Patent Number: 5,424,662
[45] Date of Patent: Jun. 13, 1995

[54] DIFFERENTIAL CURRENT MODE DRIVER CIRCUIT WITH LOW COMMON-MODE NOISE

[75] Inventor: Anthony R. Bonaccio, Shelburne, Vt.

[73] Assignee: International Business Machines Corporation, Armonk, N.Y.

[21] Appl. No.: 250,968

[22] Filed: May 31, 1994

[51] Int. Cl.6 .................................. G01R 19/00
[52] U.S. Cl. ...................... 327/55; 327/108; 327/563
[58] Field of Search ............... 307/270, 288, 315, 355, 307/443, 494, 454; 330/116, 117, 118, 255; 327/55, 57, 108, 563

[56] References Cited

U.S. PATENT DOCUMENTS

| | | | |
|---|---|---|---|
| 4,124,808 | 11/1978 | Shah et al. | 327/55 |
| 4,697,099 | 9/1987 | Bonaccio | 307/355 |
| 5,017,815 | 5/1991 | Shah et al. | 327/55 |
| 5,227,681 | 7/1993 | Koyama et al. | 307/494 |
| 5,274,275 | 12/1994 | Colles | 307/362 |
| 5,345,121 | 9/1994 | Itoh | 307/530 |

Primary Examiner—Timothy P. Callahan
Assistant Examiner—Jeffrey Zweizig
Attorney, Agent, or Firm—Thornton & Thornton

[57] ABSTRACT

An improved, differential current-mode driver circuit with low common-mode noise and high output impedance. In this circuit both sink and source currents are controlled by two pairs of emitter coupled differential amplifiers operated as current switches. One of the pairs of current switches is comprised of PNP transistors and hence slower than the other pair of current switches which is comprises of NPN transistors. The input data is applied differentially to the slower pair of the current switches and simultaneously to auxiliary switches which act as inverting amplifiers and are cross-coupled to and drive the inputs of the two faster current switches. A fifth current switch and auxiliary switch inverting amplifier is used to as an inhibit circuit to shunt both source and sink currents to ground so that no circuit node will swing excessively while holding the output nodes of the current sink and source a constant voltage thus reducing common-mode noise.

14 Claims, 2 Drawing Sheets

DIFFERENTIAL CURRENT MODE DRIVER CIRCUIT WITH LOW COMMON-MODE NOISE

FIELD OF THE INVENTION

This invention relates generally to differential driver circuits designed for use with differential current mode interfaces, and, more particularly, to a differential current mode interface driver circuit which generates substantially no common-mode noise into the interface to which it is coupled.

BACKGROUND OF THE INVENTION

Differential current mode interfaces are currently used in computer systems to connect storage devices, such as disks and tapes, to intelligent host interfaces, such as storage controllers. Such differential current mode interfaces generally consist of a plurality of pairs of wires running from the storage controller with each such pair being connected to a number of storage devices in a "daisy chain" configuration. Each such pair of wires is terminated in its differential, characteristic impedance at both ends. Drivers and receivers used with these interfaces are designed such that the impedance they present to the interface is much higher than that of the termination so that they do not substantially influence the overall interface impedance as seen from any point on the interface.

Ideally, a driver for these interfaces should be a perfect current source from which perfectly equal sink and source currents can be steered to respective ones of the two lines in each pair of wires. In theory, a simple network of linked switches that are selected by the polarity of the data input applied to the driver to cause a differential current to flow through the terminating resistors and create a differential voltage that can be sensed by any receiver on the interface will accomplish this result.

However, for reasons not pertinent to the present invention, present common-mode systems, are not and cannot be well terminated. Because of the poor terminations, the interface becomes a radiator of common-mode noise which is often converted to differential mode noise when coupled into the differential interfaces. Any imbalance that occurs in the driver current results in a common-mode component being transmitted onto the interfaces causing common-mode noise to radiate from the interfaces which, in turn, results in data transmission errors.

The driver circuits now presently used with such interfaces are based in the use of NPN bipolar transistors. These circuits work well for the differential mode but have a problem going from the inhibited (zero current output) to the enabled mode for they generate excessive common-mode noise due to the large voltage swing required at several nodes in the current source part of the circuit. This voltage swing induces a delay not matched in the current sinking part of the circuit. This induced delay causes the current sinking part of the circuit to become established before the current source part of the circuit is fully activated resulting in a negative common-mode noise transient on the interface. With the prior art circuits, the only solution, to resolve this problem in the driver circuit, was to degrade the performance of the interface to limit the conditions that would generate the common-mode noise.

Accordingly, to utilize the full performance capabilities of the interface, there now exists a need for an improved driver circuit arrangement which avoids all the above described problems associated with the excessive generation of the common-mode noise in such interfaces.

The present invention, achieves these desirable results, by bringing the data inputs differentially into the circuit to assure that the current source part of the circuit is fully activated either simultaneously with or before the current sinking part of the circuit.

SUMMARY OF THE INVENTION

It is therefore an object of the present invention is to provide an improved driver circuit in which the overall delay of the circuit is dominated by the current source path in the circuit.

It is another object of the present invention to provide a driver circuit having current control and controlling this current through complimentary cross coupled current switches.

It is another object of the invention to provide a driver circuit having differential voltage outputs and reduced voltage swings.

It is still another object of the invention to prevent voltage swing induced delays not matched in the current sinking part of the circuit.

It is still a further object of the invention to create a circuit in which the current source part of the circuit is fully activated before current sinking part of the circuit becomes established.

These desirable results and other objects and advantages, of the present invention, are realized and provided by, an improved driver circuit arrangement having pairs of fast and slow cross current switches and bringing the data differentially and simultaneously into the source current portion of the current switches and into inverting amplifiers whose outputs drive cross-coupled current sinking switches such that the overall delay of the circuit is controlled and dominated by the performance of the source current path rather than the sink current path.

These and other objects, features, and advantages of the invention will be apparent from the following more particular description of the preferred embodiment of the invention as illustrated in the accompanying drawings.

DESCRIPTION OF THE PREFERRED EMBODIMENT

Basically, the present invention, as will be more fully set forth below, describes an improved driver circuit arrangement basically comprised of pairs of PNP and NPN cross-coupled current switches and bringing the data differentially into the PNP current switches while simultaneously providing inverting amplifiers therewith whose outputs drive the NPN current switches thus causing the overall delay of the circuit to be controlled and dominated by the performance of the PNP current switches.

Figure 1:
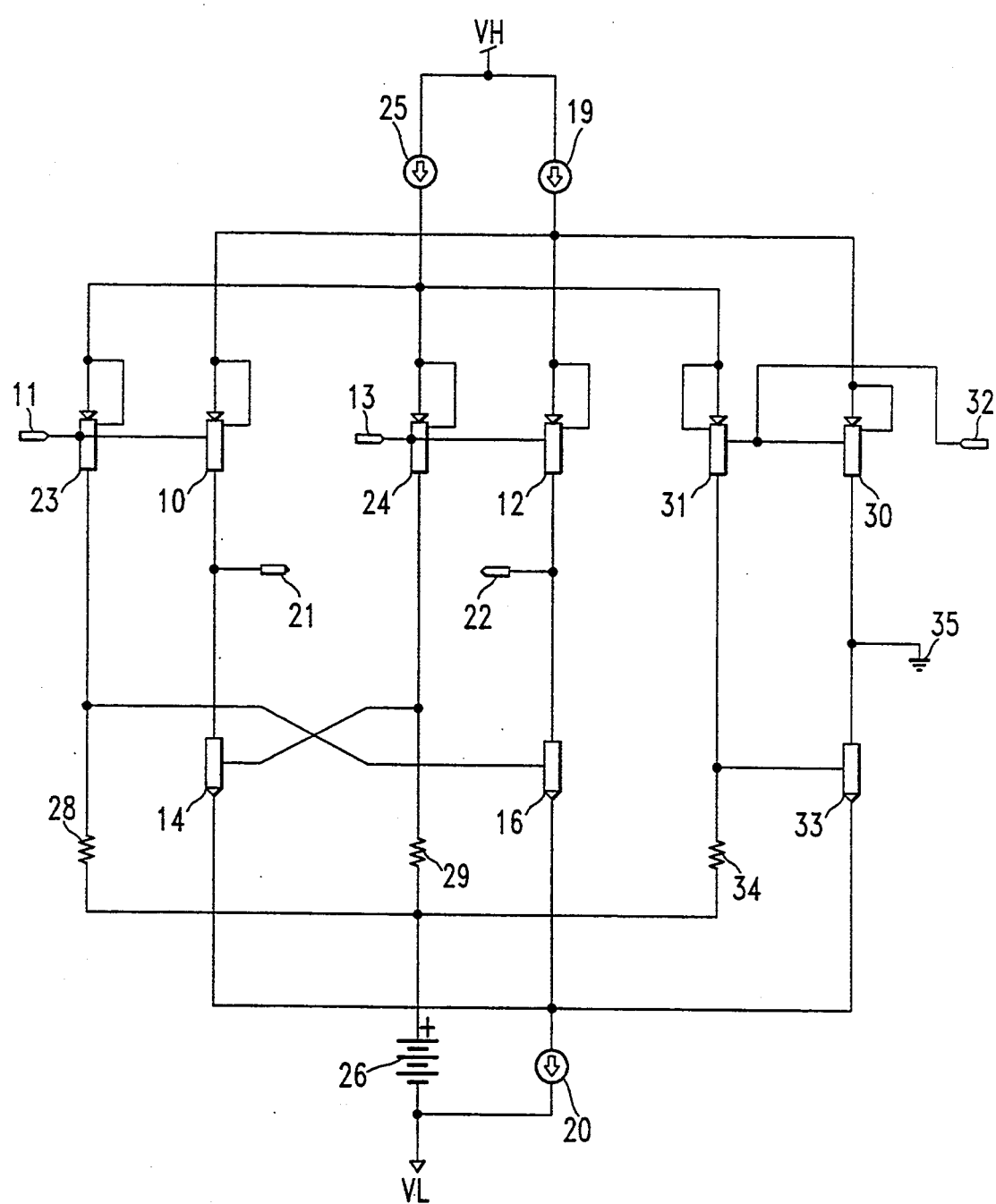
FIG. 1 shows in schematic form a simplified embodiment of the improved driver circuit of the present invention.
Figure 2:
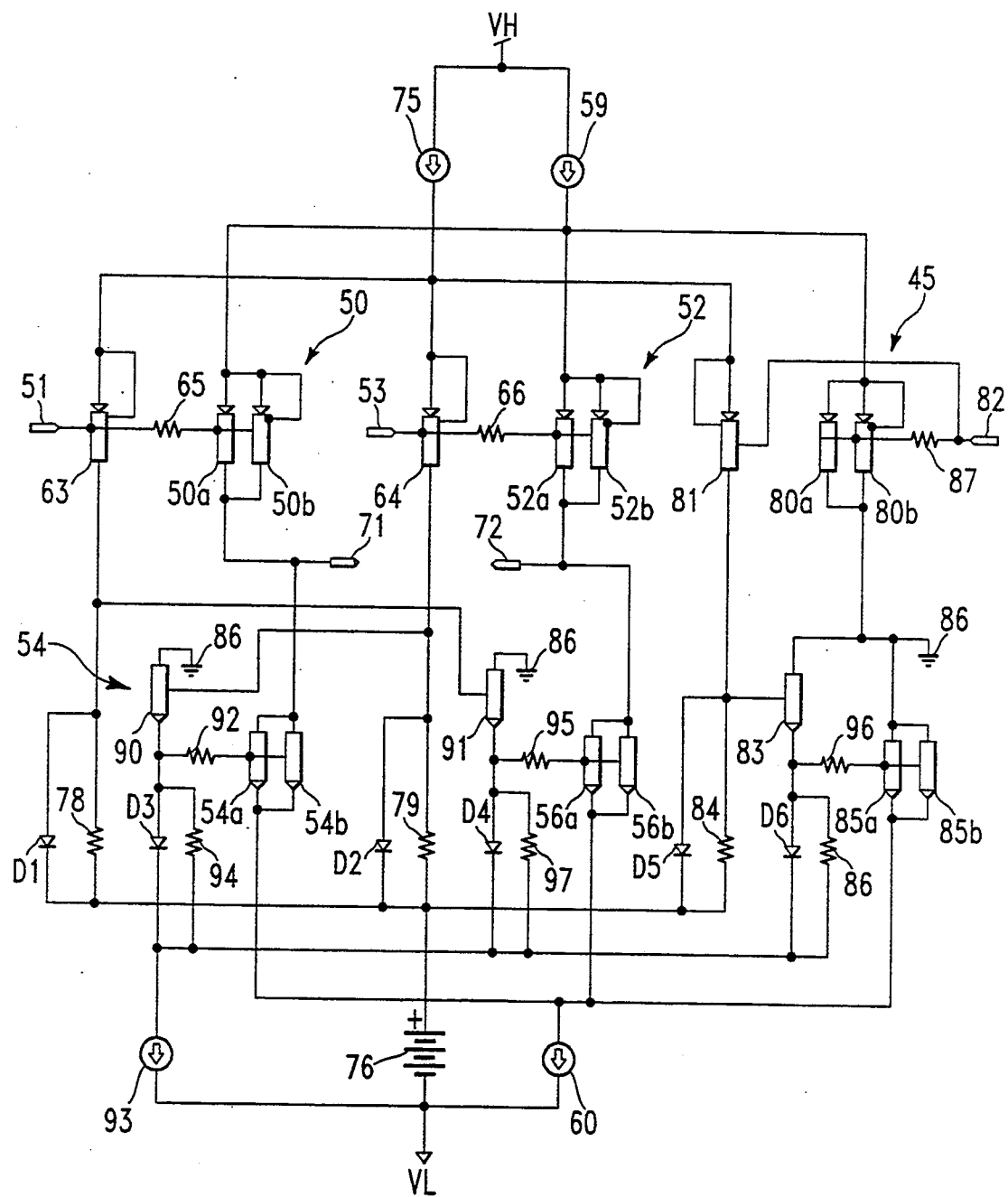
FIG. 2 shows in schematic form the improved driver circuit of the present invention as actually used.

Referring now to the drawings and especially FIGS. 1 and 2 there will be generally described the improved driver circuit of the invention.

As shown in FIG. 1 the circuit is basically comprised of four current switches coupled between current source 19 and a current sink 20. These switches are shown here as ordinary, emitter coupled, differential amplifiers comprising PNP transistors 10 and 12 and NPN transistors 14 and 16.

PNP transistors 10 and 12 have their emitters coupled together. The bases of these transistors 10 and 12 are further respectively coupled to differential inputs 11 and 13 and in common with the bases of respective PNP auxiliary switching transistors 23 and 24. The emitters of transistors 10 and 12 are further coupled through the current source 19 to a suitable voltage supply VH which is higher than ground. The collector of transistor 10 is coupled to one differential output 21 and through the NPN current switch transistor 14 to current sink 20 and thence to voltage source VL which is lower than ground.

Similarly, the collector of transistor 12 is coupled to a second differential output 22 and through the second NPN current switch transistor 16 to current sink 20 and voltage supply VL.

The emitters of switching transistors 23 and 24 are coupled through a common auxiliary current source 25 to voltage supply VH. The collector of switching transistor 23 is cross coupled to the base of transistor 16 and further coupled through a load resistor 28 and a bias supply 26 to voltage supply VL. The collector of switching transistor 24 is cross coupled to the base of transistor 14 and further coupled through a load resistor 29 to bias supply 26.

An inhibit circuit 15 is coupled to the above described four current switch circuit. This inhibit circuit 15 comprises PNP transistor 30 which has its emitter coupled to current source 19. The base of transistor 30 is further coupled to an inhibit signal input 32 and to the base of a PNP auxiliary switching transistor 31 whose emitter is coupled to the auxiliary bias source 25. The collector of transistor 30 is coupled to ground 35 and through an NPN current switching transistor 33 to current sink 20 and the voltage supply VL. The collector of switching transistor 31 is coupled to the base of NPN transistor 33 and through a load resistor 34 to bias source 26.

During operation, data pulses are applied simultaneously to the inputs 11, 13 and 32. For purposes of discussion, it will be assumed that the data pulse applied to input 11 is low and the data applied to inputs 13 and 32 is high. The low data pulse on input 11 simultaneously switches on both PNP transistors 10 and 23. When transistors 10 and 23 turn on, current begins flowing from source 19 through transistor 10 and from auxiliary source 25 through transistor 23. The current flow through the PNP auxiliary transistor 23 combined with the load resistor 28 acts, as an inverting amplifier, to turn on the cross-coupled NPN transistor 16 which rapidly pulls the output 22 down towards VL via the current sink 20.

Simultaneously the high data pulse on input 13 and 32 switches off PNP transistors 12, 24, 30 and 31 and no current flows through them. The auxiliary transistor 24 in combination with the load resistor 29 acts, as an inverting amplifier, to turn off the cross coupled NPN transistor 14 allowing the current flow through transistor 10 to pull the output 21 towards the voltage source VH. With the inhibit transistors 30 and 31 off, the inhibit circuit 15 is inactive and has no effect.

Because the setting of both outputs 21 and 22 are simultaneously controlled via the NPN transistors 14 and 16 no node in the circuit requires more than a few hundred millivolts and the output nodes of the current sink 20 and the current source 19 remain at a constant voltage. Thus common-mode noise generation is significantly reduced over that achieved by the prior art circuits.

PNP transistors tend to be slower than NPN transistors. By using this characteristic of the PNP transistors, the overall delay of the circuit dominates and controls the performance of the circuit. Thus the circuit of the present invention is contrary to the teachings of the prior art which always attempted to control the circuit via the fastest elements in the circuit.

This is particularly true of the inhibit current path. When the driver is to be inhibited, i.e., when it is desired that both outputs 21 and 22 be deactivated, the inputs 11 and 13 are deactivated, i.e., allowed to both go high, and the inhibit input 32 is pulled low. This results in transistors 30, 31 and 33 all being turned on such that the source current from the source 19 and the sink current from source 20 are both shunted directly to ground 35 through transistors 30 and 33 such that the total ground current is simply the mismatch between the source current from source 19 and the sink current from source 20. The total ground current is small and may be held to be especially minute by extracting both the current sources 19 and 20 from a common current reference. Because of this configuration no node in the circuit, of the present invention, is required to move more than a few hundred millivolts and the output nodes of the current sink 20 and the current source 19 remain constant. In this way common-mode noise generation is significantly reduced in both rising and falling transitions over that achieved by the prior art circuits.

Thus there has been taught a switching circuit in which data is differentially introduced into the PNP transistor based switches of the circuit while simultaneously using the same data to drive inverting amplifiers whose outputs drive the NPN transistor based switches to quickly and accurately set the output levels during both rising and falling transitions. This causes the overall delay of the circuit to be controlled and dominated only by the performance of the PNP transistor dominated path and simultaneously holds all voltage swings in the circuit to a minimum value so that the output of the current source and current sink remain at a constant voltage. This results in significantly reduced common-mode noise transition when the circuit of the invention is used as the differential current mode interface for connecting storage devices to storage controllers.

FIG. 2 shows a preferred embodiment of the circuit of FIG. 1. As in FIG. 1, the circuit shown is basically comprised of four current switches 50, 52, 54, and 56 coupled between a current source 59 and a current sink 60. Two of these switches 50 and 52 each comprises a respective pair of parallel, PNP, emitter coupled, differential amplifier transistors 50a and 50b and 52a and 52b. These differential amplifier transistors have their emitters coupled together and through the current source 59 to voltage supply VH. The bases of the transistors 50a and 50b are connected together, and, through a resistor 65, to differential input 51 and to the base of the PNP auxiliary switching transistors 63. The collectors of transistors 50a and 50b are coupled to the first differential output 71 and through the current switch transistor 54 to current sink 60 and voltage supply VL.

The transistors 52a and 52b are similarly connected, i.e., their bases are connected together and through a resistor 66, connected to the other differential input 53 and to the base of a PNP auxiliary switching transistors 64.

Similarly, the collectors of transistors 52a and 52b are coupled to the second differential output 72 and through the current switch transistor 56 to current sink 60 and voltage supply VL.

The emitters of switching transistors 63 and 64 are coupled through the common auxiliary current source 75 to voltage supply VH. The collector of switching transistor 63 is cross-coupled to the base of an emitter follower transistor 91, in current switch 56, and through a load resistor 78, in parallel with a clamping diode D1, and a bias supply 76 to voltage supply VL. The collector of switching transistor 64 is cross coupled to the base of an emitter follower transistor 90, in current switch 54 and through a load resistor 79, in parallel with clamping diode D2 to bias supply 76. Each of the emitter follower transistors have their collectors coupled to ground 86.

The first differential output 71 is connected through a pair of parallel, common emitter, NPN transistors 54a and 54b, in current switch 54, to current sink 60. The bases of transistors 54a and 54b are connected, via a biasing resistor 92, to the emitter of the emitter follower transistor 90 and also to a follower bias current source 93, through a clamping diode D3 in parallel with a load resistor 94 and thence to voltage source VL. The switch 54 is thus effectively a form of the well known Darlington circuit or Darlington pair.

The second differential output 72 is connected through a pair of parallel, common emitter, NPN transistors 56a and 56b, in current switch 56, to current sink 60. The bases of these transistors 56a and 56b are connected, via a biasing resistor 95, to the emitter of emitter follower transistor 91 and to a follower bias current source 93, through a clamping diode D4 in parallel with a load resistor 97 and thence to VL. The switch 56 is also thus effectively a form of the well known Darlington circuit or Darlington pair.

An inhibit circuit 45 is coupled to the above described circuit. This inhibit circuit 45 comprises a parallel pair of PNP transistors 80a and 80b which have their respective emitters through current source 59 to VH. The bases of transistors 80a and 80b are further, through a resistor 87, coupled to an inhibit signal input 82 and a PNP auxiliary switching transistor 81 whose emitter is coupled through a auxiliary bias source 75 to VH. The collectors of transistors 80a and 80b are coupled to ground 86 and through parallel NPN current switching transistors 85a and 85b and current sink 60 to voltage supply VL. The collectors of transistors 80a and 80b are further coupled through an emitter follower transistor 83 and a diode D6, in parallel with a load resistor 86, to follower bias source 93 and thence to VL. The base of emitter follower transistor 83 is connected to the collector of transistor 81 and through a diode D5, in parallel with load resistor 84 to biasing source 76.

The operation of FIG. 2 is as follows. Data is brought differentially on the inputs 51 and 53. For purposes of discussion, it will be assumed that input 51 falls and input 53 rises. The falling pulse on input 51 switches on PNP transistors 63 and 50a, 50b and current begins flowing through them. The resistor 65 prevents current overshoot in the parallel resistors 50a and 50b. The PNP auxiliary transistor 63 combined with the load resistor 78 acts as an inverting amplifier to apply a positive signal at the base of transistor 91 to turn on the current switch 56, formed of NPN emitter follower transistor 91 and transistors 56a and 56b. The diode D1 connected across the resistor 78 act as a clamp to maintain the voltage at a fixed point reducing the time needed to turn on the transistor 91. The turning on of transistor 91 turns on the parallel transistors 56a and 56b causing the output 72 to be pulled down, via the current sink 60, towards VL. Again the resistor 95 positioned between the base of transistor 91 and parallel transistors 56a and 56b prevent current overshoot in the parallel transistors 56a and 56b and hence improves the stability of the circuit. It should be noted that this current switch is formed of a Darlington circuit pair which further increases the switching speed especially in this pull down or falling transition.

Simultaneously the rising pulse on input 53 switches off PNP transistors 52a and 52b and 64. When these transistors turn off current ceases to flow through them. The auxiliary transistor 64 combined with the load resistor 79 also acts as an inverting amplifier applying a positive signal on the base of transistor 90 to turn off the current switch 54 allowing the output 71 to rise towards VH. Again it should be noted that the diode D2 across resistor 79 clamps the voltage at the base of transistors 90.

By providing the current switches with parallel devices the reliability of the circuit is significantly improved since the current carried by each device is decreased.

When the driver is to be inhibited, i.e., when zero current flow is desired at both outputs 71 and 72, the inputs 51 and 53 are deactivated, i.e., allowed to go high, and the inhibit input 82 is pulled low. This results in transistors 80a and 80b and 31 all being turned on to shunt the current from the current source 19 directly to ground 86 through transistors 80a and 80b. With the turning on of transistor 81 the emitter follower transistor 83 also turns on turning on the parallel transistors 85a and 85b to couple the sink current source 60 to ground 86. Again no node in the circuit is required to move more than a few hundred millivolts and the output nodes of the current sink 60 and the current source 59 again remain at a constant voltage and again common-mode noise generation is significantly reduced over that achieved by the prior art circuits. It is to be noted that the transistor 83 in conjunction with transistors 85a and 85b form a Darlington pair as discussed above.

Thus there has been taught a switching circuit in which data can be differentially introduced into the slower switches of the circuit while simultaneously providing inverting amplifiers whose outputs drive the faster switches thus causing the overall delay of the circuit to be controlled and dominated by the performance of the slowest path in the circuit.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A driver circuit comprising:
   four current switches coupled in pairs between a current source and a current sink;
   a first two of said four current switches being coupled directly to said current source, to respective differential data inputs and to respective differential data outputs;
   respective inverting amplifiers being coupled directly to said respective differential data inputs;
   a second two of said four current switches being coupled to said current sink, each being coupled to a respective one of said differential outputs, serially coupled to a respective one of said first two of said current switches and cross-coupled to the other one of said respective differential data inputs via said respective inverting amplifiers such that the overall delay of the circuit is dominated by the performance of said first two current switches.

2. The circuit of claim 1 wherein said first two of current switches are comprised of PNP transistors, each of which has a base, an emitter and a collector.

3. The circuit of claim 2 wherein said second two of current switches are comprised of NPN transistors, each of which has a base, an emitter and a collector.

4. The circuit of claim 2 wherein said second pair of current switches each comprise a darlington pair.

5. The circuit of claim 3 wherein the emitters of said PNP transistors are coupled together and to said current source and their bases are coupled to a respective one of said data inputs and their collectors are coupled to a respective one of said data outputs and to the collector of a respective one of said NPN transistors, and
   the emitters of said NPN transistors are connected together and coupled to said current sink.

6. The circuit of claim 4 wherein the emitters of said PNP transistors are connected together and coupled to said current source and their bases are coupled to a respective one of said data inputs and their collectors are coupled to a respective one of said data outputs and to the collector of a respective one of said NPN transistors, and
   said darlington pair comprises an emitter follower transistor coupled to a current switch transistor.

7. The circuit of claim 4 wherein each of said inverting amplifiers are formed of a respective PNP transistor, each having an emitter, a base and a collector coupled through a respective load resistor to said current sink.

8. The circuit of claim 6 wherein said the collectors of said PNP transistors are coupled to a second current source equal to the base current of said transistors.

9. The circuit of claim 7 wherein said emitters of said NPN transistors are coupled to a second current sink to supply a current equal to the base current of said devices.

10. The circuit of claim 6 wherein said inverting amplifiers are coupled between a current source and a biasing voltage source.

11. The circuit of claim 9 wherein said circuit further includes an inhibit circuit comprising an current switch coupled to said current source, to ground and through a switching transistor to said current sink and to an amplifier transistor 12. The circuit of claim 2 wherein said circuit has a first pair of current switches being formed of parallel PNP transistors having common emitters, common collectors and common bases.

13. The circuit of claim 12 wherein said second pair of current switches each comprise a switching transistor having a base emitter and a collector contact, with is collector coupled to ground and its emitter coupled through a voltage clamp to a second sink current source and through a biassing resistor to the base of a current transistor having a base emmiter and a collector,
   the collector of said current transistor being coupled a respective data output and its emmiter coupled to said current sink,
   The base of said switching transistor being coupled to the collector of the inverting transistor coupled to said other current switch and through a clamp to a voltage source.

14. A driver circuit comprising:
   four current switches coupled in pairs between a current source and a current sink;
   a first two of said current switches being PNP transistors, each of which has a base, an emitter and a collector;
   each of said PNP transistors having their bases coupled directly to a respective inverting amplifier and to respective differential data inputs, their collectors coupled to respective differential data outputs, and their emitters coupled to said current source;
   respective inverting amplifiers being coupled directly to said respective differential data inputs;
   a second two of said four current switches being comprised of NPN transistors, each of which has a base, an emitter and a collector, their emitters being coupled to said current sink, their collectors being coupled to a respective one of said differential outputs and to a respective one of said PNP transistors, their bases being cross-coupled to the other one of said respective differential data inputs via said respective inverting amplifiers such that the overall delay of the circuit is dominated by the performance of said first two current switches.

* * * * *